(12) United States Patent
Crabb et al.

(10) Patent No.: US 9,748,120 B2
(45) Date of Patent: *Aug. 29, 2017

(54) APPARATUS FOR LIQUID TREATMENT OF DISC-SHAPED ARTICLES AND HEATING SYSTEM FOR USE IN SUCH APPARATUS

(71) Applicant: LAM RESEARCH AG, Villach (AT)

(72) Inventors: Kevin Matthew Crabb, Villach (AT); Philipp Engesser, Lindau (DE); Vijay Kumar Badam, Villach (AT)

(73) Assignee: LAM RESEARCH AG, Villach (AT)

( * ) Notice: Subject to any disclaimer, the term of this patent is extended or adjusted under 35 U.S.C. 154(b) by 1094 days.

This patent is subject to a terminal disclaimer.

(21) Appl. No.: 13/932,926

(22) Filed: Jul. 1, 2013

(65) Prior Publication Data
US 2015/0001202 A1    Jan. 1, 2015

(51) Int. Cl.
| H01L 21/673 | (2006.01) |
| H01L 21/687 | (2006.01) |
| F27B 5/14 | (2006.01) |
| F27D 5/00 | (2006.01) |
| F27D 11/02 | (2006.01) |
| H01L 21/67 | (2006.01) |
| F27B 17/00 | (2006.01) |
| F27D 99/00 | (2010.01) |

(52) U.S. Cl.
CPC .......... *H01L 21/67115* (2013.01); *F27B 5/14* (2013.01); *F27B 17/0025* (2013.01); *F27D 5/0037* (2013.01); *F27D 2099/0008* (2013.01)

(58) Field of Classification Search
None
See application file for complete search history.

(56) References Cited

U.S. PATENT DOCUMENTS

| 4,871,417 A | 10/1989 | Nishizawa et al. |
| 4,903,717 A | 2/1990 | Sumnitsch |
| 4,982,693 A | 1/1991 | Ebata |
| 5,513,668 A | 5/1996 | Sumnitsch |
| 5,595,606 A * | 1/1997 | Fujikawa .......... C23C 16/45561 118/715 |
| 5,667,622 A | 9/1997 | Hasegawa et al. |
| 5,762,391 A | 6/1998 | Sumnitsch |
| 5,818,137 A | 10/1998 | Nichols et al. |

(Continued)

FOREIGN PATENT DOCUMENTS

| EP | 0504431 A1 | 9/1992 |
| EP | 1791161 A2 | 5/2007 |

(Continued)

OTHER PUBLICATIONS

International Search Report dated Aug. 28, 2008, from corresponding PCT Application (PCT/EP2008/058568).

(Continued)

*Primary Examiner* — Joseph M Pelham

(57) ABSTRACT

An apparatus for treating a disc-shaped article comprises a spin chuck and at least three individually controllable infrared heating elements. The infrared heating elements are mounted in a stationary manner with respect to rotation of said spin chuck. The infrared heating elements are arranged in a nested configuration so as to define individually controllable inner, middle and outer heating zones adjacent a disc-shaped article when positioned on the spin chuck.

11 Claims, 6 Drawing Sheets

(56) References Cited

U.S. PATENT DOCUMENTS

| | | | |
|---|---|---|---|
| 5,859,408 A | 1/1999 | Baxendine | |
| 5,882,433 A | 3/1999 | Ueno | |
| 5,927,305 A | 7/1999 | Shiba | |
| 5,965,047 A | 10/1999 | Blersch et al. | |
| 6,051,303 A | 4/2000 | Katsuda et al. | |
| 6,093,252 A | 7/2000 | Wengert et al. | |
| 6,121,579 A * | 9/2000 | Aoki | C23C 16/481 118/730 |
| 6,198,074 B1 * | 3/2001 | Savas | C23C 16/46 118/725 |
| 6,219,936 B1 | 4/2001 | Kedo et al. | |
| 6,328,846 B1 | 12/2001 | Langen et al. | |
| 6,357,457 B1 | 3/2002 | Taniyama et al. | |
| 6,358,676 B1 | 3/2002 | Wu | |
| 6,435,200 B1 | 8/2002 | Langen | |
| 6,443,168 B1 | 9/2002 | Morita et al. | |
| 6,485,531 B1 | 11/2002 | Schob | |
| 6,491,764 B2 | 12/2002 | Mertens et al. | |
| 6,517,998 B1 | 2/2003 | Noda et al. | |
| 6,536,454 B2 | 3/2003 | Lindner | |
| 6,550,988 B2 | 4/2003 | Sugimoto et al. | |
| 6,843,857 B2 | 1/2005 | Bergman | |
| 6,863,741 B2 | 3/2005 | Orii et al. | |
| 6,867,150 B2 | 3/2005 | Kikuchi et al. | |
| 6,982,006 B1 | 1/2006 | Boyers et al. | |
| 7,173,216 B2 | 2/2007 | Ptak | |
| 7,467,635 B2 | 12/2008 | Satoshi et al. | |
| 7,509,035 B2 | 3/2009 | Ranish et al. | |
| 7,806,989 B2 | 10/2010 | Sekiguchi et al. | |
| 7,837,803 B2 | 11/2010 | Hohenwarter | |
| 7,891,314 B2 | 2/2011 | Pichler | |
| 7,965,372 B2 | 6/2011 | Noda et al. | |
| 8,133,327 B2 | 3/2012 | Tokuno et al. | |
| 8,147,618 B2 | 4/2012 | Passegger | |
| 8,211,242 B2 | 7/2012 | Inoue et al. | |
| 8,277,564 B2 | 10/2012 | Le et al. | |
| 8,294,068 B2 | 10/2012 | Ranish et al. | |
| 8,404,499 B2 | 3/2013 | Moffatt | |
| 8,596,623 B2 | 12/2013 | Frank et al. | |
| 8,821,681 B2 | 9/2014 | Puggl et al. | |
| 9,093,482 B2 * | 7/2015 | Brugger | H01L 21/67051 |
| 9,136,155 B2 * | 9/2015 | Kinoshita | H01L 21/6838 |
| 9,245,777 B2 * | 1/2016 | Plazonic | H01L 21/67115 |
| 9,265,091 B2 * | 2/2016 | Ueshima | H05B 3/0033 |
| 9,316,443 B2 | 4/2016 | Hohenwarter et al. | |
| 9,355,883 B2 | 5/2016 | Hohenwarter et al. | |
| 2002/0002991 A1 | 1/2002 | Lindner | |
| 2002/0032973 A1 | 3/2002 | Jung | |
| 2002/0096196 A1 | 7/2002 | Toshima et al. | |
| 2003/0196683 A1 | 10/2003 | Izumi et al. | |
| 2003/0213436 A1 | 11/2003 | Kwon | |
| 2004/0055707 A1 | 3/2004 | Sato et al. | |
| 2004/0069320 A1 | 4/2004 | Bergman | |
| 2004/0250839 A1 | 12/2004 | Robertson et al. | |
| 2005/0193952 A1 | 9/2005 | Goodman et al. | |
| 2006/0042722 A1 | 3/2006 | Kim et al. | |
| 2006/0086713 A1 | 4/2006 | Hunter et al. | |
| 2006/0112980 A1 | 6/2006 | Jeong et al. | |
| 2006/0201363 A1 | 9/2006 | Nakatsukasa et al. | |
| 2006/0231125 A1 | 10/2006 | Yi | |
| 2007/0017555 A1 | 1/2007 | Sekiguchi et al. | |
| 2007/0087568 A1 | 4/2007 | Koyata et al. | |
| 2007/0093071 A1 | 4/2007 | Verhaverbeke et al. | |
| 2007/0113872 A1 | 5/2007 | Uchida et al. | |
| 2007/0227556 A1 | 10/2007 | Bergman | |
| 2007/0295365 A1 | 12/2007 | Miya et al. | |
| 2008/0066337 A1 | 3/2008 | Seki | |
| 2008/0110861 A1 | 5/2008 | Kajita et al. | |
| 2008/0190454 A1 | 8/2008 | Eitoku | |
| 2008/0226272 A1 | 9/2008 | Kasai et al. | |
| 2008/0314870 A1 | 12/2008 | Inoue et al. | |
| 2009/0011523 A1 | 1/2009 | Gale | |
| 2009/0126762 A1 | 5/2009 | Nomura et al. | |
| 2009/0133715 A1 | 5/2009 | Maekawa | |
| 2010/0054720 A1 | 3/2010 | Hunter et al. | |
| 2010/0055314 A1 | 3/2010 | Kato et al. | |
| 2010/0200163 A1 | 8/2010 | Puggl et al. | |
| 2010/0229797 A1 * | 9/2010 | Kato | C23C 16/402 118/730 |
| 2010/0236579 A1 | 9/2010 | Araki et al. | |
| 2011/0151675 A1 | 6/2011 | Frank et al. | |
| 2012/0085372 A1 | 4/2012 | Plihon | |
| 2012/0103371 A1 | 5/2012 | Yun et al. | |
| 2012/0138097 A1 | 6/2012 | Okorn-Schmidt et al. | |
| 2012/0160274 A1 | 6/2012 | Kasai et al. | |
| 2013/0042813 A1 * | 2/2013 | Kato | C23C 16/45578 118/730 |
| 2013/0061805 A1 | 3/2013 | Jin et al. | |
| 2013/0061873 A1 | 3/2013 | Hohenwarter et al. | |
| 2013/0143406 A1 | 6/2013 | Hsu et al. | |
| 2013/0160260 A1 | 6/2013 | Frank et al. | |
| 2014/0054280 A1 * | 2/2014 | Hohenwarter | H01L 21/67051 219/392 |
| 2014/0091079 A1 * | 4/2014 | Ueshima | H01L 21/67115 219/552 |
| 2014/0102637 A1 | 4/2014 | Brugger et al. | |
| 2014/0127908 A1 | 5/2014 | Okutani | |
| 2015/0079803 A1 | 3/2015 | Huang et al. | |
| 2016/0064242 A1 | 3/2016 | Obweger et al. | |
| 2016/0118278 A1 * | 4/2016 | Plazonic | H01L 21/67115 392/418 |

FOREIGN PATENT DOCUMENTS

| | | |
|---|---|---|
| JP | 63185029 | 7/1988 |
| JP | 2001070859 A | 3/2001 |
| JP | 2001319909 A | 11/2001 |
| JP | 2001319910 A | 11/2001 |
| JP | 2003257926 A | 9/2003 |
| JP | 2006148010 A | 6/2006 |
| JP | 2009206359 A | 9/2009 |
| JP | 2010129809 A | 6/2010 |
| JP | 5166718 B2 | 3/2013 |
| KR | 20090012703 A | 2/2009 |
| WO | 2004/084278 | 9/2004 |
| WO | 2006/008236 | 1/2006 |
| WO | WO-2007101764 A1 | 9/2007 |
| WO | 2009/010394 | 1/2009 |
| WO | 2011/007287 | 1/2011 |

OTHER PUBLICATIONS

International Search Report, dated Dec. 6, 2012, corresponding PCT/IB2012/054450.

International Search Report, dated Sep. 22, 2011 in, PCT/IB2010/055550.

Machine Generated English Translation of JP 2001-319910A held to Taniyama Hiromi et al. Published Nov. 16, 2001.

Translation of Japanese Office Action, dated Oct. 23, 2012, from corresponding JP application.

English translation of JP Office Action, dated Nov. 24, 2015; Application No. 2013-535537.

International Search Report dated May 4, 2012 in International application No. PCT/IB11/54386.

Translation of KR 10-2009-0012703.

U.S. Appl. No. 13/593,264, filed Aug. 23, 2012. (no U.S. publication No. assigned yet).

* cited by examiner

APPARATUS FOR LIQUID TREATMENT OF DISC-SHAPED ARTICLES AND HEATING SYSTEM FOR USE IN SUCH APPARATUS

BACKGROUND OF THE INVENTION

1. Field of the Invention

The invention relates to an apparatus for liquid treatment of disc-shaped articles, and to a heating system for use in such an apparatus.

2. Description of Related Art

Liquid treatment includes both wet etching and wet cleaning, wherein the surface area of a wafer to be treated is wetted with a treatment liquid and a layer of the wafer is thereby removed or impurities are thereby carried off. A device for liquid treatment is described in U.S. Pat. No. 4,903,717. In this device the distribution of the liquid may be assisted by the rotational motion imparted to the wafer.

Techniques for processing a surface of a disc-shaped article are typically used in the semiconductor industry on silicon wafers, for example of 300 mm or 450 mm diameter. However, such techniques may be applied for other plate-like articles such as compact discs, photo masks, reticles, magnetic discs or flat panel displays. When used in semiconductor industry they may also be applied for glass substrates (e.g. in silicon-on-insulator processes), III-V substrates (e.g. GaAs) or any other substrate or carrier used for producing integrated circuits.

When using heated process liquids, there is a problem in achieving temperature uniformity across the surface of the wafer, and the need to address that problem becomes more acute as wafer diameters increase.

In particular, as the wafer diameter increases, so too will the temperature differential between a liquid at the point where it is applied in a central region of the wafer and the same liquid after it has travelled radially outwardly to the periphery of the wafer. This results in varied etch rates as a function of the distance from the center of the wafer, and hence poor process uniformity.

Conventional approaches to alleviate this problem have included dispensing process liquid from movable arms, so-called "boom swing" dispensers; however, this involves an increase in the cost and complexity of the device as well as its operation. The problem can be addressed to some extent by increasing the flow of process liquid, and/or by dispensing a high temperature liquid such as deionized water on the opposite side of the wafer; however, these techniques result in higher consumption of process liquids.

Commonly-owned co-pending application U.S Patent Application Pub. No. 2013/0061873 describes improved apparatus equipped with an infrared heater for heating a wafer to enhance process uniformity. Although the devices of that patent application represent an improvement over conventional techniques, there remains a need to provide further enhanced process uniformity and control.

SUMMARY OF THE INVENTION

Thus, in one aspect, the present invention relates to an apparatus for treating a disc-shaped article, comprising a spin chuck for holding a disc-shaped article in a predetermined orientation relative to an upper surface of the spin chuck, and at least three individually controllable infrared heating elements mounted above the upper surface of the spin chuck and below a disc-shaped article when mounted on the spin chuck. The infrared heating elements are mounted in a stationary manner with respect to rotation of the spin chuck. The at least three individually controllable infrared heating elements are arranged in a nested configuration so as to define individually controllable inner, middle and outer heating zones adjacent a disc-shaped article when positioned on the spin chuck.

In preferred embodiments of the apparatus according to the present invention, each of the heating elements has at least one of a shape and a position such that each of the heating elements heats regions of differing distance from the axis of rotation of the spin chuck.

In preferred embodiments of the apparatus according to the present invention, each of the heating elements comprises a curved portion that extends generally along an arc of a circle that is eccentric to the axis of rotation of the spin chuck.

In preferred embodiments of the apparatus according to the present invention, each of the heating elements comprises two curved portions interconnected by a straight portion, such that each of the heating elements is generally C-shaped.

In preferred embodiments of the apparatus according to the present invention, a first one of the two curved portions extends generally along an arc of a first circle and a second one of the two curved portions extends generally along an arc of a second circle, the first and second circle having centers that are offset from one another.

In preferred embodiments of the apparatus according to the present invention, each of the two curved portions extends generally along an arc of a same circle.

In preferred embodiments of the apparatus according to the present invention, each the heating element comprises two straight portions interconnected by a curved portion.

In preferred embodiments of the apparatus according to the present invention, the two straight portions are parallel to one another.

In preferred embodiments of the apparatus according to the present invention, each of the heating elements comprises a curved portion extending along an arc of a circle, and wherein the circle for each heating element is concentric with the circle for at least two others of the heating elements.

In preferred embodiments of the apparatus according to the present invention, a circle circumscribing emitting portions of any one of the at least three individually controllable infrared heating elements does not intersect a circle circumscribing emitting portions of any others of the at least three individually controllable infrared heating elements.

In preferred embodiments of the apparatus according to the present invention, the apparatus includes a plate that is transparent to infrared radiation emitted by the at least three individually controllable infrared heating elements, said plate being positioned between said at least three individually controllable infrared heating elements and a disc-shaped article when positioned on the spin chuck.

In preferred embodiments of the apparatus according to the present invention, the plate is part of a housing that surrounds the at least three individually controllable infrared heating elements.

In preferred embodiments of the apparatus according to the present invention, the housing is mounted in a stationary manner with respect to rotation of the spin chuck.

In another aspect, the present invention relates to an infrared heating assembly for use in an apparatus for treating a disc-shaped article. The infrared heating assembly comprises at least three individually controllable infrared heating elements mounted in a common frame connector. The at least three individually controllable infrared heating elements are arranged in a nested configuration so as to define individually controllable inner, middle and outer heating zones. Each of the heating elements has at least one of a shape and a position such that each of the heating elements extends over regions of differing distance from the center of a circle circumscribing the infrared heating assembly.

In preferred embodiments of the infrared heating assembly according to the present invention, each of the at least three individually controllable infrared heating elements comprises at least one curved portion and at least one straight portion.

In preferred embodiments of the infrared heating assembly according to the present invention, the curved portions of adjacent infrared heating elements extend along concentric circles and the straight portions of adjacent heating elements are parallel to one another.

In preferred embodiments of the infrared heating assembly according to the present invention, the common frame connector comprises a plurality of electrical connectors equal in number to the at least three individually controllable infrared heating elements, thereby to permit individual connection of each of the at least three individually controllable infrared heating elements to a controller for individually energizing each of the at least three individually controllable infrared heating elements.

In preferred embodiments of the infrared heating assembly according to the present invention, the assembly includes a housing surrounding the at least three individually controllable infrared heating elements, the housing comprising a plate forming an upper portion thereof, the plate being transparent to the infrared radiation emitted by the at least three individually controllable infrared heating elements.

In yet another aspect, the present invention the present invention relates to an infrared lamp for use in heating a disc-shaped workpiece in such a way that the infrared lamp radiates light onto the disc-shaped workpiece while the infrared lamp and the disc-shaped workpiece rotate relative to each other. The infrared lamp comprises an arc-shaped emitting part generally describing a circle that is eccentric in relation to an axis of rotation of the disc-shaped workpiece, and an adjoining emitting part disposed inside the circle and extending from the arc-shaped emitting part generally along a chord of the circle.

In preferred embodiments of the infrared lamp for use in heating a disc-shaped workpiece according to the present invention, the adjoining emitting part has a linear shape.

In preferred embodiments of the infrared lamp for use in heating a disc-shaped workpiece according to the present invention, the lamp includes a second arc-shaped emitting part at an end of the adjoining emitting part opposite the arc-shaped emitting part.

In preferred embodiments of the infrared lamp for use in heating a disc-shaped workpiece according to the present invention, the adjoining emitting part is integrally connected to an end of the arc-shaped emitting part.

In preferred embodiments of the infrared lamp for use in heating a disc-shaped workpiece according to the present invention, the arc-shaped emitting part and the adjoining emitting part are integrally formed and each is round in cross-section.

In yet another aspect, the present invention relates to a heating apparatus comprising an infrared lamp positioned facing a disc-shaped workpiece, the heating apparatus heating the disc-shaped workpiece in such a way that the infrared lamp radiates light onto the disc-shaped workpiece while the infrared lamp and the disc-shaped workpiece rotate relative to each other. The infrared lamp comprises an arc-shaped emitting part generally describing a circle that is eccentric in relation to an axis of rotation of the disc-shaped workpiece, and an adjoining emitting part disposed inside the circle and extending from the arc-shaped emitting part generally along a chord of the circle. The heating apparatus comprises a plurality of the infrared lamps, wherein the arc-shaped emitting parts of the infrared lamps are positioned concentrically to one another.

In preferred embodiments of the heating apparatus according to the present invention, the adjoining emitting part of each of the infrared lamps does not intersect a circle circumscribing the arc-shaped emitting part of the corresponding adjacent inner infrared lamp.

In preferred embodiments of the heating apparatus according to the present invention, the infrared lamp further comprises a second arc-shaped emitting part at an end of the adjoining emitting part opposite the arc-shaped emitting part.

In preferred embodiments of the heating apparatus according to the present invention, ends of the arc-shaped emitting part and the second arc-shaped emitting part define an angle whose vertex is on an axis of rotation of the disc-shaped article.

In preferred embodiments of the heating apparatus according to the present invention, the adjoining emitting part of each of the infrared lamps is integrally connected to an end of the corresponding arc-shaped emitting part.

In preferred embodiments of the heating apparatus according to the present invention, the adjoining emitting part of each of the infrared lamps does not extend outwardly from the circle described by the corresponding arc-shaped emitting part.

BRIEF DESCRIPTION OF THE DRAWINGS

Other objects, features and advantages of the invention will become more apparent after reading the following detailed description of preferred embodiments of the invention, given with reference to the accompanying drawings, in which:

FIG. 9 is a graph showing the depth of material etched when using the lamp assembly of the FIGS. 1-3 embodiment with all three IR lamps turned on;

FIG. 11 is a graph showing the depth of material etched when using the lamp assembly of the FIGS. 1-3 embodiment with the inner and middle IR lamps turned off and the outer IR lamp turned on.

DETAILED DESCRIPTION OF PREFERRED EMBODIMENTS

Figure 1:
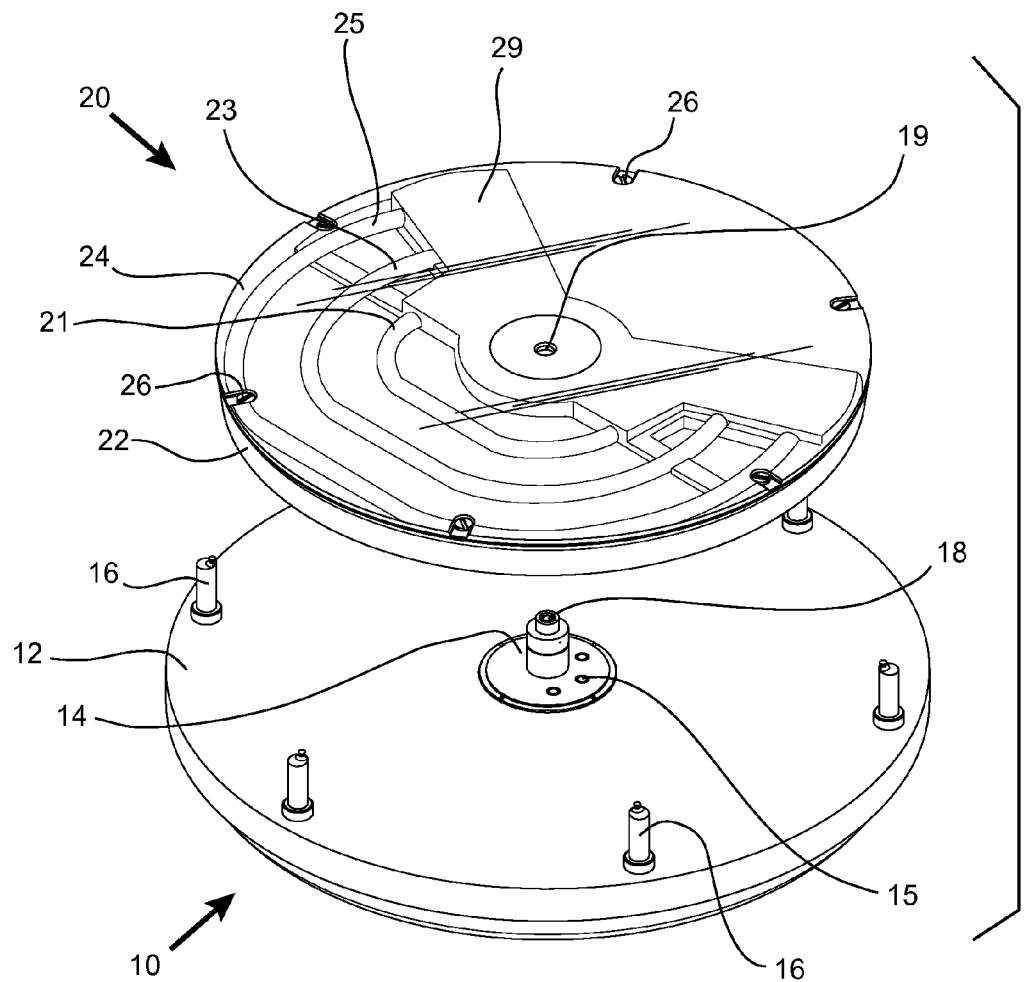
FIG. 1 is an exploded perspective view of an apparatus for treating disc-shaped articles according to an embodiment of the present invention.
Figure 2:
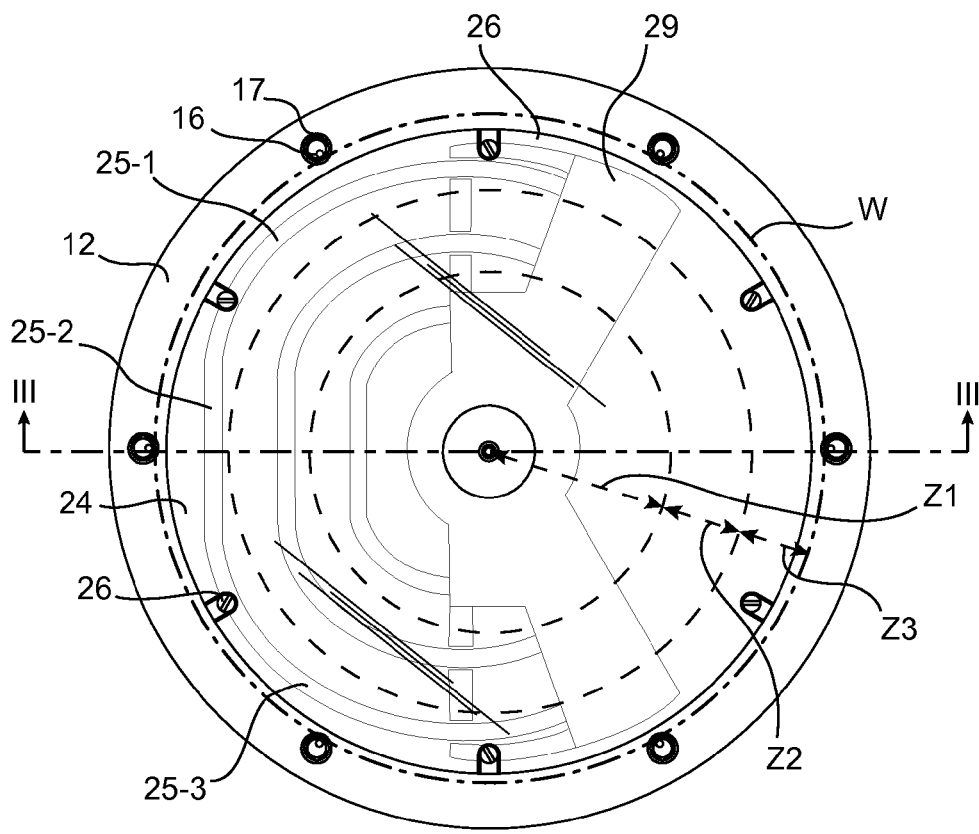
FIG. 2 is top plan view of the embodiment of FIG. 1.

Referring now to the drawings, FIGS. 1 and 2 depict an apparatus made up of two principal subassemblies, namely, a base spin chuck 10 and a modular infrared heating assembly 20. The spin chuck 10 comprises a rotary main body 12 that is mounted for rotation about a stationary central hollow post 14. This post 14 in turn comprises a central nozzle 18 for dispensing process liquid or gas onto the underside of a wafer when mounted on the spin chuck, as well a series of female electrical sockets 15 in a shoulder of the post 14, which sockets receive corresponding male connectors (not shown) that depend downwardly from the heating assembly 20, and which supply driving current to the IR heating lamps inside that assembly 20.

The chuck body 12 has mounted therein a series of gripping pins 16, which operate generally as described in the above-referenced U.S. Pat. No. 4,903,717, in that the pins 16 are driven in unison by a common ring gear between a radially outer open position and a radially inner closed position in with the upper ends of these pins engage the edge of a disc-shaped article to be treated.

The heating assembly 20 in this embodiment is formed as a modular unit comprising a lower dished housing or shell 22 that contains the IR lamps 21, 23, 25. A cover 24 is screwed onto the lower housing 22 by a series of peripheral screws 26, which are six in number in this embodiment.

The cover 24 in this embodiment is a plate formed from a material that is transparent to the wavelengths of IR radiation emitted by the lamps 21, 23, 25, and this plate 24 may be formed for example of sapphire or quartz glass, as is known to those skilled in this art. The plate 24 has a small central opening 19 formed therein, to permit passage of the upper end of dispensing nozzle 18.

Within the housing of the heating assembly 20, that is, inside the lower housing 22 and beneath the transparent plate 24, there is mounted a set of three infrared heating lamps 21, 23, 25, which are carried by a common frame 29 that also incorporates the associated electrical supply wiring (not shown). The assembly formed by the housing formed of lower shell 22 and upper plate 24, frame 29 and lamps 21, 23, 25 in this embodiment is rigidly mounted to the stationary post 14.

Referring now to FIG. 2, it can be seen that the wafer W is now supported by the ends of pins 16 projecting adjacent the outer periphery of the heating assembly 20. The phantom line in FIGS. 2 and 3 designates the position of a wafer W when held by the apparatus, with the underside of wafer W being spaced by a small defined gap from the cover 24.

The wafer W is centered above the heating assembly 20, which in turn is centered on the axis of rotation of the underlying spin chuck. It will be appreciated that the spin chuck 10 is therefore designed to hold a wafer W of a specified diameter. In the embodiments described herein, that diameter is 300 mm, which is a common diameter of silicon wafer at present. However, the apparatus may of course be designed to hold disc-shaped articles of other diameters, such as 200 mm and 450 mm.

In the plan view of FIG. 2 it can be seen that each of the three heating elements in this embodiment is made of two curved portions (25-1 and 25-3 in the case of the outer heating element 25) interconnected by a straight portion (25-2 in the case of the outer heating element 25). The middle and inner heating elements 23 and 21, respectively, have the same shape. The heating elements 21, 23, 25 of this embodiment are thus generally C-shaped. Moreover, while the curved portions (e.g., 25-1, 25-3) of these heating elements generally follow a circular arc, and while the adjacent curved portions of all three heating elements are preferably substantially concentric, the circles described by those curved portions are not in this embodiment concentric with the center of the heating assembly 20 and hence are not concentric with the axis of rotation of the spin chuck.

Consequently, in this embodiment, both the position and shape of the heating elements 21, 23, 25 is such that, as the wafer W is rotated by the chuck 10 relative to the stationary heating elements 21, 23, 25, each heating element effectively "travels" radially relative to the rotating wafer W, in that each heating element heats an annular region whose radial extent is significant greater than the cross-sectional diameter of the heating elements. For the present embodiment, those zones are delimited by the circles shown in broken line in FIG. 2, and those zones are designated Z1, Z2 and Z3 in FIG. 2.

It will be appreciated that each heating element also contributes to some extent to the heating in the zone or zones adjacent thereto. The broken line circles in FIG. 2 thus delineate the position at which the predominant heating effect changes from one heating element to the next.

Figure 3:
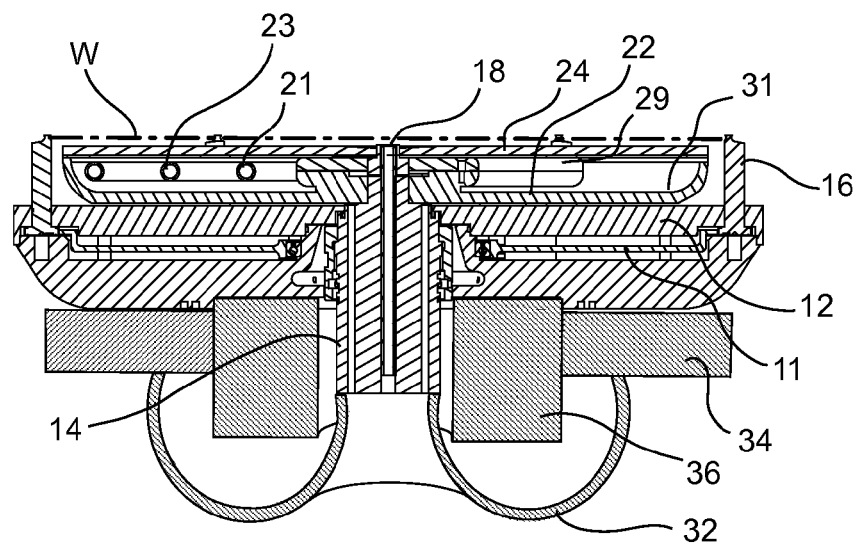
FIG. 3 is an axial section through the chuck depicted in FIGS. 1 and 2, taken along the line III-III of FIG. 2.

In FIG. 3, it can be seen that the frame 29 is supported within the housing 22, 24, with the housing of the heating assembly 20 being in this embodiment rigidly secured to the stationary post 14, and thus with the frame 29 and lamps 21, 23, 25 also being mounted in a stationary manner to the post 14. The upwardly-facing surface of the lower housing part or shell 22 is preferably provided with a suitable IR reflective coating 31, to aid in directing the IR radiation emitted by lamps 21, 23, 25, upwardly through the transparent plate 24 and onto the downwardly facing surface of the wafer W.

The stationary post 14 is mounted onto the frame 32 of the apparatus, which in this embodiment also carries a stator 34. Stator 34 in turn drives rotor 36, which is attached to the body 12 of spin chuck 10. Also visible in FIG. 3 is the ring gear 11 mentioned above, which drives the gripping pins 16 in unison.

It will be appreciated that in the embodiments described herein, the entire heating assembly is mounted in a stationary manner on the post 14, as is described for example in connection with the heating assembly disclosed in commonly-owned co-pending application U.S Patent Application Pub. No. 2013/0061873.

Figure 4:
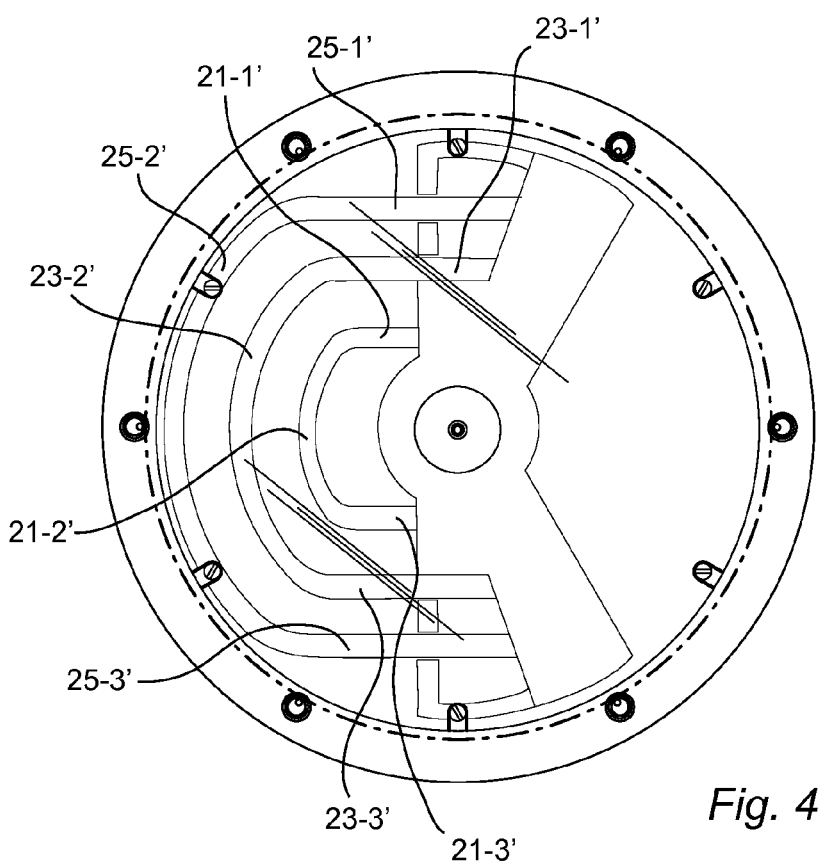
FIG. 4 is a view similar to that of FIG. 2, of another embodiment of an apparatus according to the present invention.

FIG. 4 depicts another embodiment, in which the infrared lamps 21', 23', 25' are shaped differently than in the preceding embodiments. In particular, each lamp comprises two straight portions 21-1', 21-3', 23-1', 23-3', 25-1', 25-3', and one straight portion 21-2', 23-2', 25-2'. The shape and position of the straight portions of these elements contribute to the creation of heating zones as described in connection with the preceding embodiments.

Figure 5:
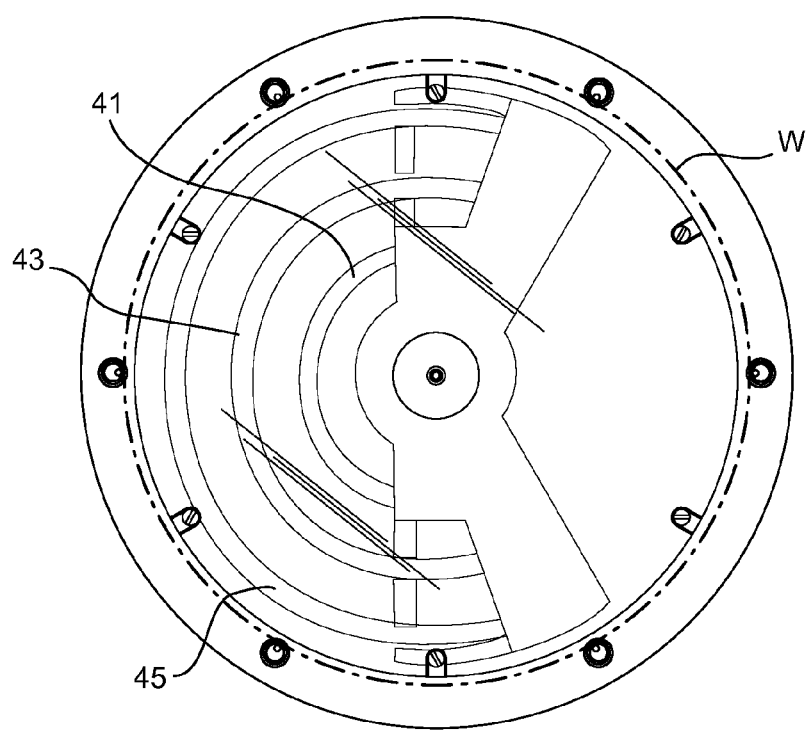
FIG. 5 is a view similar to that of FIG. 2, of yet another embodiment of an apparatus according to the present invention.

FIG. 5 depicts yet another embodiment, in which each of the three heating elements 41, 43, 45 is a continuous curved tubular element. Moreover, while these heating elements generally follow a circular arc, and while all three heating elements are preferably substantially concentric, the circles described by those heating elements are not in this embodiment concentric with the center of the heating assembly 20 and hence are not concentric with the axis of rotation of the spin chuck.

Consequently, in this embodiment, both the position and shape of the heating elements 41, 43, 45 is such that, as the wafer W is rotated by the chuck 10 relative to the stationary heating elements 41, 43, 45, each heating element also heats an annular region whose radial extent is significant greater than the cross-sectional diameter of the heating elements, as in the preceding embodiments.

Figure 6:
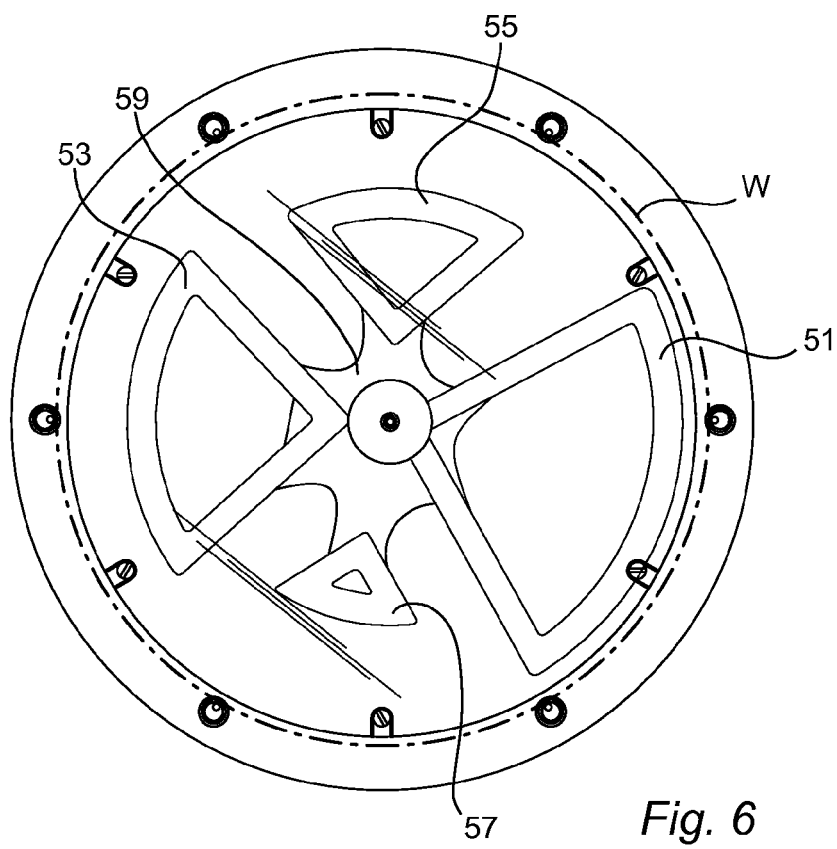
FIG. 6 is a view similar to that of FIG. 2, of still another embodiment of an apparatus according to the present invention.
Figure 7:
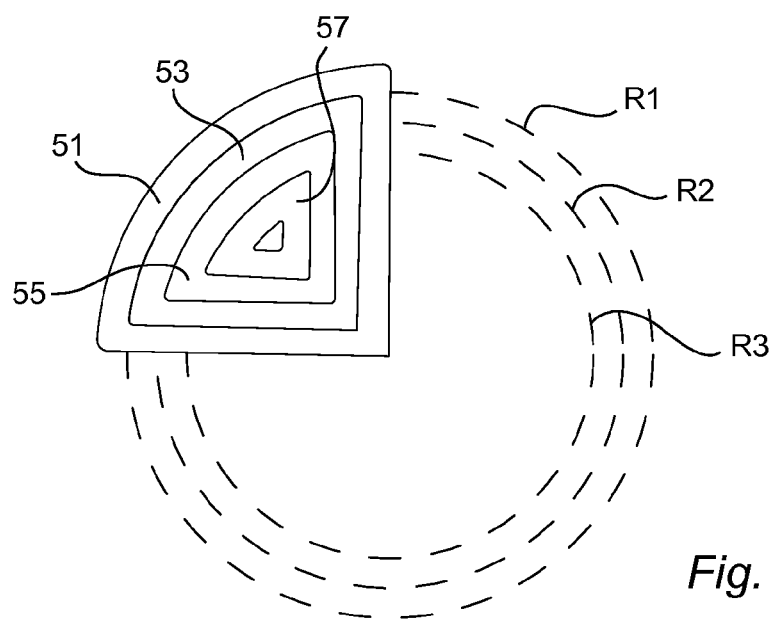
FIG. 7 is an explanatory view for better understanding the relative shapes and sizes of the lamps utilized in the embodiment of FIG. 6.

FIGS. 6 and 7 illustrate a still further approach to the design of the heating lamps. In this embodiment, four individually controllable IR heating lamps 51, 53, 55, 57 are mounted on a suitable carrier frame 59 in the manner as generally as described in connection with the preceding embodiments. The housing 20 and spin chuck 10 are as previously described.

The conceptual diagram of FIG. 7 reveals the interrelationship between the shapes and sizes of these lamps 51, 53, 55, 57. In particular, the outer periphery of the curved part of lamp 53 describes a circle R1 that is also coincident with the inner periphery of the curved part of lamp 51. Similarly, the outer periphery of the curved part of lamp 55 describes a circle R2 that is also coincident with the inner periphery of the curved part of lamp 53, and the outer periphery of the curved part of lamp 57 describes a circle R3 that is also coincident with the inner periphery of the curved part of lamp 55. Furthermore, the outer periphery of the largest lamp 51 approximately coincides with a one-fourth quadrant of the circular housing 20.

Therefore, when the lamps 51, 53, 55, 57 are mounted as shown in FIG. 6, there are effectively no gaps in the heated regions of the wafer W, as the wafer is rotated in relation to the stationary lamps.

It is to be noted that the heating lamps in each of the preceding embodiments are preferably individually controllable. It is particularly preferred that each lamp can be not only switched on and off independently of the others, but also that the wattage to each lamp can be independently varied. This permits a variety of advantageous process control.

Figure 8:
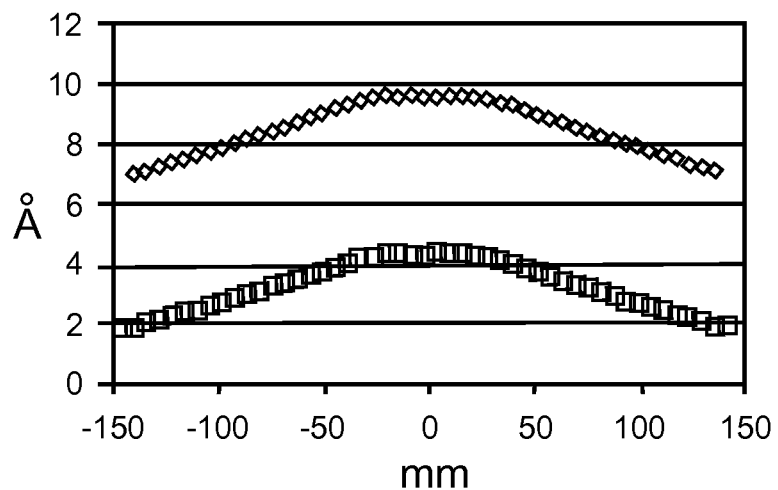
FIG. 8 is a graph showing the depth of material etched when using the lamp assembly of the FIGS. 1-3 embodiment with all three IR lamps turned off.

For example, FIG. 8 shows, for purposes of comparison, etching profiles achieved when using the heating lamp assembly of FIGS. 1-3 but without powering any of the three IR lamps 21, 23, 25. As can be seen, there is a markedly greater removal of material from the wafer in the central region of the wafer as compared to the peripheral region. This is because etchant dispensed centrally of the wafer has cooled substantially as it travels radially outwardly across a 300 mm diameter wafer. Moreover, this undesired etching profile is largely the same regardless of whether the etching chemistry, temperature and flow are selected to etch 4 Å or 9 Å of material. In either case, the material removed at the outer periphery of the wafer is less by about 2Å.

Figure 9:
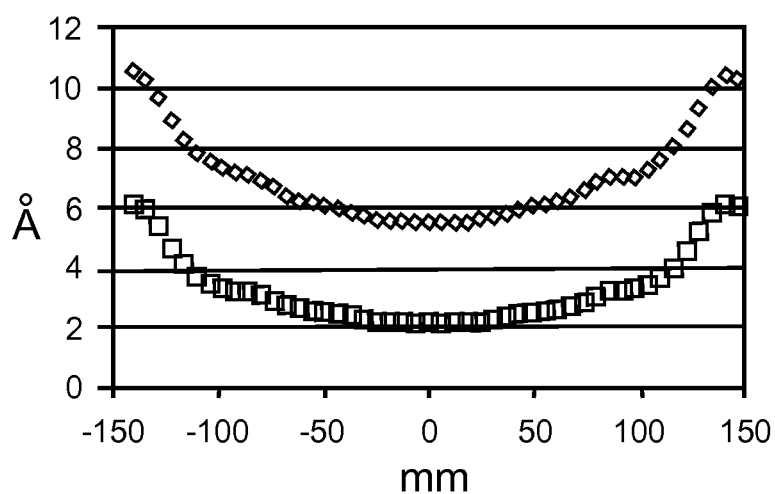

By contrast, FIG. 9 shows etching profiles achieved by appropriately powering all three of the lamps 21, 23, 25. The etching profiles have been nearly inverted relative to those of FIG. 8. It should be noted also that these profiles are attained at lower flow rates and shorter processing times than for the data of FIG. 8. It should also be noted that for many process specifications, the ideal etching profile is not necessarily flat; instead, as in FIG. 9, a desired etching profile will often call for "overetching" of the peripheral wafer region, e.g., removing approximately 10% more material at the wafer edge than at the wafer center. As can be seen in FIG. 9, the apparatus and heating assemblies of the present invention are particularly well-suited to such applications.

Figure 10:
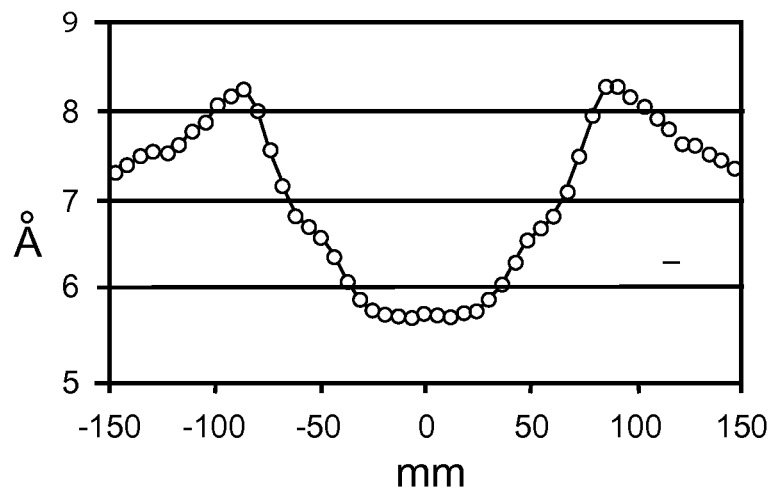
FIG. 10 is a graph showing the depth of material etched when using the lamp assembly of the FIGS. 1-3 embodiment with the inner and middle IR lamps turned on and the outer IR lamp turned off.
Figure 11:
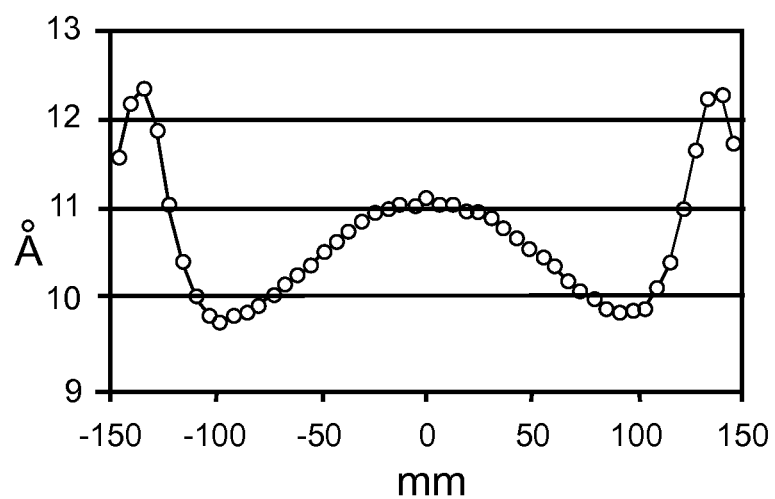

FIG. 10 shows the profile attained when only the lamps 21, 23 are powered, whereas FIG. 11 shows the profile attained when only the lamp 25 is powered. In neither case does the resulting profile resemble those of FIG. 9.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for treating a disc-shaped article, comprising:
   a spin chuck for holding the disc-shaped article in a predetermined orientation relative to an upper surface of the spin chuck; and
   at least three individually-controllable heating elements mounted above the upper surface of the spin chuck and below the disc-shaped article when mounted on the spin chuck, wherein the at least three individually-controllable heating elements are mounted in a stationary manner with respect to rotation of the spin chuck,
   wherein the at least three individually-controllable heating elements are arranged in a nested configuration so as to define individually-controllable inner, middle and outer heating zones adjacent to the disc-shaped article when positioned on the spin chuck.

2. The apparatus according to claim 1, wherein each of the at least three individually-controllable heating elements has at least one of a shape and a position such that each of the at least three individually-controllable heating elements heats regions of differing distance from an axis of rotation of the spin chuck.

3. The apparatus according to claim 2, wherein each of the at least three individually-controllable heating elements comprises a curved portion that extends generally along an arc of a circle that is eccentric to the axis of rotation of the spin chuck.

4. The apparatus according to claim 1, wherein each the at least three individually-controllable heating element comprises two straight portions interconnected by a curved portion.

5. The apparatus according to claim 4, wherein the two straight portions are parallel to one another.

6. The apparatus according to claim 1, wherein each of the at least three individually-controllable heating element comprises a curved portion extending along an arc of a circle, and wherein the circle for each heating element is concentric with the circle for at least two others of the at least three individually-controllable heating elements.

7. The apparatus according to claim 1, wherein a circle circumscribing emitting portions of any one of the at least three individually-controllable heating elements does not intersect a circle circumscribing emitting portions of any others of the at least three individually-controllable heating elements.

8. The apparatus according to claim 1, further comprising a plate that is transparent to radiation emitted by the at least three individually-controllable heating elements, the plate being positioned between the at least three individually-controllable heating elements and the disc-shaped article when positioned on the spin chuck.

9. The apparatus according to claim 8, wherein the plate is part of a housing that surrounds the at least three individually-controllable heating elements.

10. The apparatus according to claim 9, wherein the housing is mounted in a stationary manner with respect to rotation of the spin chuck.

11. The apparatus of claim 1, wherein the at least three individually-controllable heaters comprise infrared heaters.

* * * * *